(12) United States Patent
Bright et al.

(10) Patent No.: US 6,558,191 B2
(45) Date of Patent: May 6, 2003

(54) STACKED TRANSCEIVER RECEPTACLE ASSEMBLY

(75) Inventors: Edward J. Bright, Middletown; Steven L. Flickinger, Hummelstown; William L. Herb, Harrisburg, all of PA (US)

(73) Assignee: Tyco Electronics Corporation, Middletown, PA (US)

( * ) Notice: Subject to any disclaimer, the term of this patent is extended or adjusted under 35 U.S.C. 154(b) by 172 days.

(21) Appl. No.: 09/933,697

(22) Filed: Aug. 21, 2001

(65) Prior Publication Data

US 2002/0025720 A1 Feb. 28, 2002

Related U.S. Application Data

(60) Provisional application No. 60/226,995, filed on Aug. 22, 2000.

(51) Int. Cl.[7] .......................... H01R 13/60; H01R 13/66
(52) U.S. Cl. ...................... 439/541.5; 439/607; 439/79
(58) Field of Search .................. 439/541.5, 79, 439/74, 607–608, 92, 95; 385/75, 92, 88–89; 359/152, 163; 361/719, 796, 816

(56) References Cited

U.S. PATENT DOCUMENTS

| | | | | |
|---|---|---|---|---|
| 5,329,428 A | * | 7/1994 | Block et al. .................. 439/74 |
| 5,531,612 A | * | 7/1996 | Goodall et al. .......... 439/541.5 |
| 5,709,568 A | * | 1/1998 | Pan et al. ................. 439/541.5 |
| 5,757,998 A | * | 5/1998 | Thatcher et al. .............. 385/75 |
| 5,767,999 A | * | 6/1998 | Kayner ....................... 359/163 |
| 6,095,862 A | * | 8/2000 | Doye et al. ................. 439/607 |
| 6,115,263 A | * | 9/2000 | Babineau et al. ........... 439/630 |
| 6,146,195 A | * | 11/2000 | Chang ..................... 439/541.5 |

* cited by examiner

Primary Examiner—Gary F. Paumen
Assistant Examiner—Felix O. Figueroa

(57) ABSTRACT

Transceiver receptacles (12a, 12b) are mounted on both sides of an intermediate circuit board (10). Each of the transceiver receptacles includes a host connector (14) disposed within a shielding cage (16). The host connector is electrically connected to the intermediate circuit board and is configured for electrically mating with a respective transceiver module (20), and the shielding cage is configured to receive and guide the respective transceiver module into mating engagement with the host connector. An electrically conductive bezel spacer (36) is disposed in gaps between the shielding cages to reduce propagation of electromagnetic interference. Mating connectors (41, 42) electrically connect the intermediate circuit board (10) to a main circuit board (40).

11 Claims, 6 Drawing Sheets

STACKED TRANSCEIVER RECEPTACLE ASSEMBLY

CROSS-REFERENCE TO RELATED APPLICATION

This application claims the benefit of U.S. Provisional Application No. 60/226,995 filed Aug. 22, 2000.

FIELD OF THE INVENTION

The invention relates to an electrical connector assembly that permits multiple transceiver modules to be arranged in a high-density package.

BACKGROUND OF THE INVENTION

Various international and industry standards define electrical connectors and transceivers that are used to interface communications equipment and devices for networking applications. One type of transceiver developed by an industry consortium is known as a small form-factor pluggable (SFP) transceiver. This transceiver comprises a module having a plug-in portion which mates with a host connector that is mounted on a circuit board. The host connector resides within a cage that provides shielding against electromagnetic interference (EMI). The cage, which is significantly larger than the host connector, is dimensioned to receive and guide the transceiver module into mating connection with the host connector. Thus, the cage and the host connector together comprise a receptacle for an individual transceiver module.

Each transceiver module is a discrete unit, and a plurality of these modules can be plugged into a respective plurality of transceiver receptacles on a circuit board. Since it is desirable for electronic equipment to be compact, there is a need to minimize the space required to mount a plurality of transceiver modules in such equipment.

SUMMARY OF THE INVENTION

It is an object of the invention to provide multiple transceiver receptacles in a compact package.

It is another object of the invention to simplify the installation of multiple transceiver receptacles in electronic equipment.

These and other objects are accomplished by an electrical connector assembly according to the invention.

The invention is an electrical connector assembly that comprises an intermediate circuit board having first and second transceiver receptacles mounted on respective opposite sides of the board. Each of the first and second transceiver receptacles includes a host connector disposed within a shielding cage. The host connector is electrically connected to the intermediate circuit board and is configured for electrically mating with a respective transceiver module, and the shielding cage is configured to receive and guide the respective transceiver module into mating engagement with the host connector.

According to another aspect of the invention, a plurality of first transceiver receptacles are mounted on one side of the intermediate circuit board, and a plurality of second transceiver receptacles are mounted on the other side of the intermediate circuit board. The shielding cages of the first and the second transceiver receptacles are spaced-apart from each other by gaps, and an electrically conductive bezel spacer is disposed in the gaps.

BRIEF DESCRIPTION OF THE DRAWINGS

The invention will now be described by way of example with reference to the accompanying drawings wherein.

DESCRIPTION OF A PREFERRED EMBODIMENT

Figure 1:
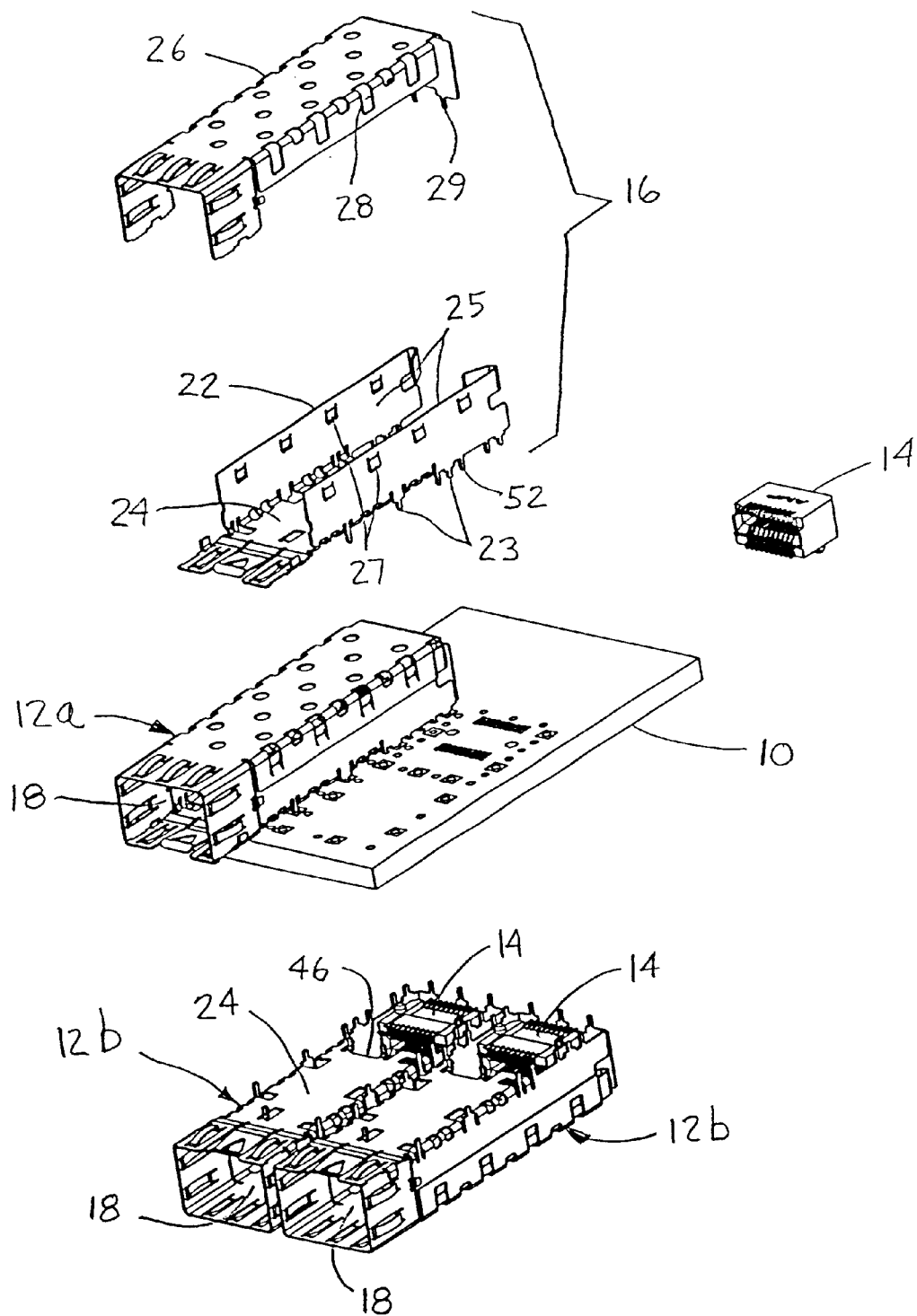
FIG. 1 is an exploded isometric view of a stacked transceiver receptacle assembly according to the invention.

There is shown in FIG. 1 an exploded view of a stacked transceiver receptacle assembly according to the invention. The receptacle assembly includes an intermediate circuit board 10, a pair of first transceiver receptacles 12a mounted on one side of the intermediate circuit board, and a pair of second transceiver receptacles 12b mounted on an opposite side of the intermediate circuit board. Each of the first and second transceiver receptacles 12a, 12b comprises a host connector 14 and a shielding cage 16. The host connector 14 is mounted on and electrically connected to the intermediate circuit board 10. The host connector 14 is preferably a card edge connector having contacts extending into a slot that is configured to receive a plug-in card edge located at a back end 19 of a transceiver module 20 (see FIG. 2). Such a host connector 14 is sold by Tyco Electronics Corporation of Harrisburg, Pa. as part number 1367073-1.

Still referring to FIG. 1, the shielding cage 16 is made from electrically conductive material and includes a bottom cage 22 and a top cage 26. The bottom cage 22 has mounting posts 23 that are electrically connected with ground paths on the intermediate circuit board 10, and EMI suppression pins 52 that extend into holes in the intermediate circuit board but are not electrically connected to the board. The bottom cage 22 has a bottom wall 24 adjacent to the intermediate circuit board. An opening 46 at the rear of the bottom wall 24 is sized to permit the host connector 14 to extend through the bottom wall so that the host connector resides between side walls 25 of the bottom cage 22. The top cage 26 is mounted on the bottom cage 22 and is secured thereto by lanced tabs 27 of the bottom cage that are snap-fitted into apertures 28 of the top cage. The top cage 26 has EMI suppression pins 29 that extend into holes in the intermediate circuit board 10 but are not electrically connected to the board.

Figure 2:
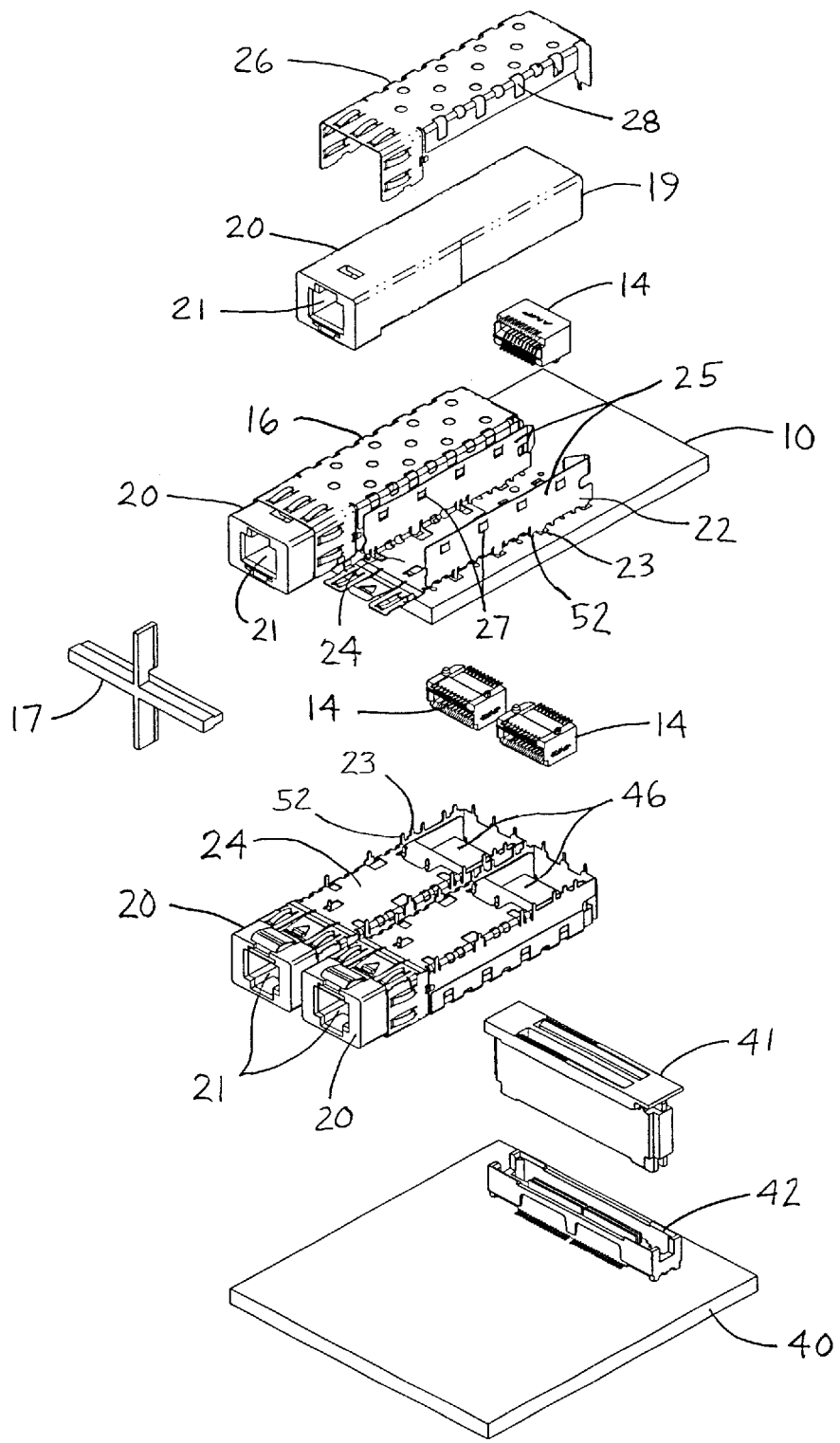
FIG. 2 is an exploded isometric view of the stacked transceiver receptacle assembly, along with transceiver modules that are received in the assembly.

The shielding cage 16 has an interior space 18 between the top cage 26 and the bottom cage 22. The interior space 18 is dimensioned to accommodate a transceiver module 20, as shown in FIG. 2. The shielding cage provides a barrier to electromagnetic interference (EMI) that may originate either internally or externally of the transceiver module 20. A shielding cage as shown and described is sold by Tyco Electronics Corporation as part number 1367035-1 for the top cage, and part number 1367034-1 for the bottom cage.

As shown, the first transceiver receptacles 12a are identical to the second transceiver receptacles 12b, and the pairs of first and second transceiver receptacles are mounted in mirror-image relationship on respective opposite sides of the intermediate circuit board 10. However, it should be understood that the invention encompasses alternative embodiments wherein the first and second transceiver receptacles are of different types and/or are not mounted in mirror-image relationship.

The transceiver module 20 is installed into the interior space 18 through the front of the shielding cage 16 and is guided by the shielding cage into mating engagement with the host connector 14 at the rear of the shielding cage. The transceiver module includes a connecting port 21 such as an MT-RJ fiber optic connector-receiving port. Such a transceiver module is sold by Tyco Electronics Corporation as part number 1382349-1.

Figure 3:
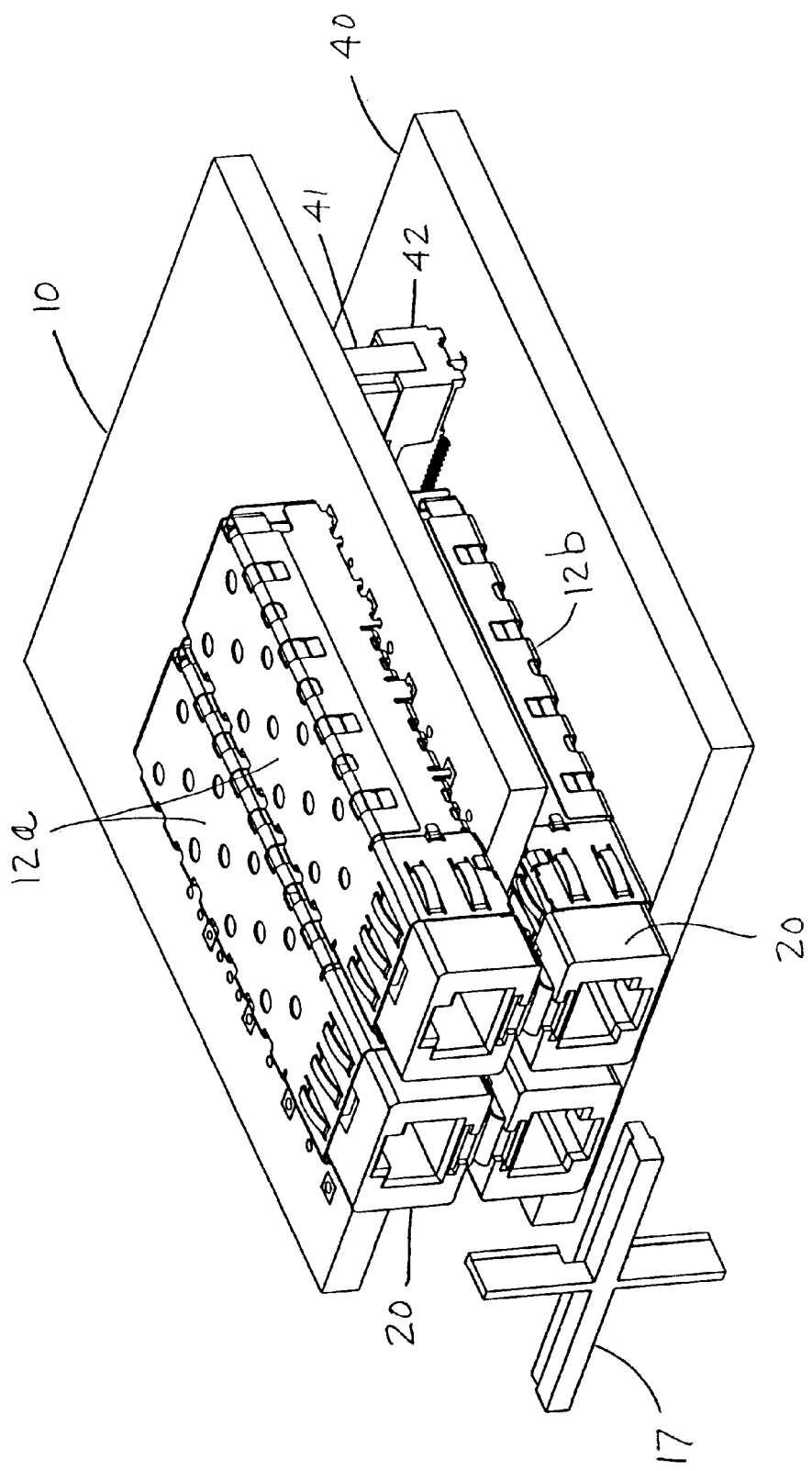
FIG. 3 is an isometric view of a two-by-two stacked transceiver receptacle assembly with transceiver modules, showing a bevel spacer exploded away.
Figure 4:
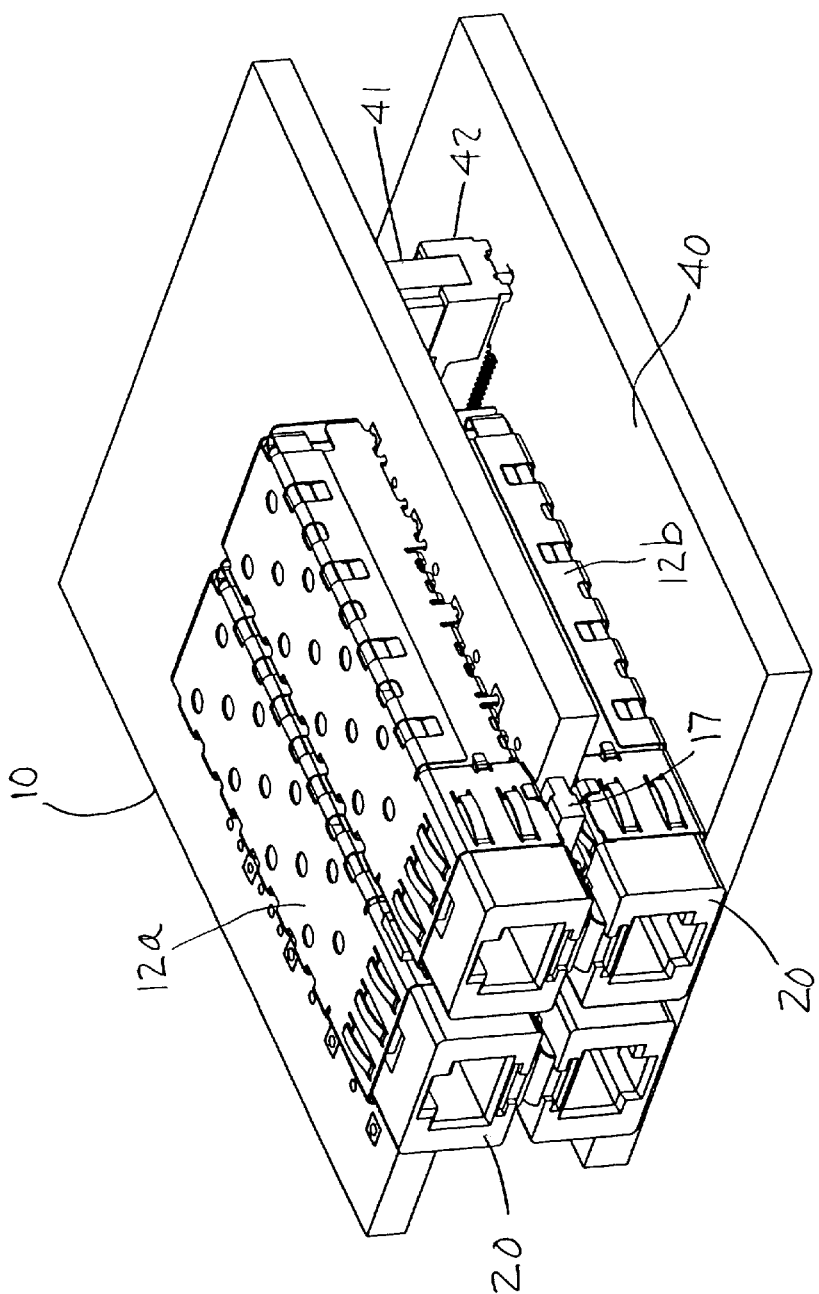
FIG. 4 is an isometric view similar to FIG. 3 with the bevel spacer in position in the assembly.
Figure 5:
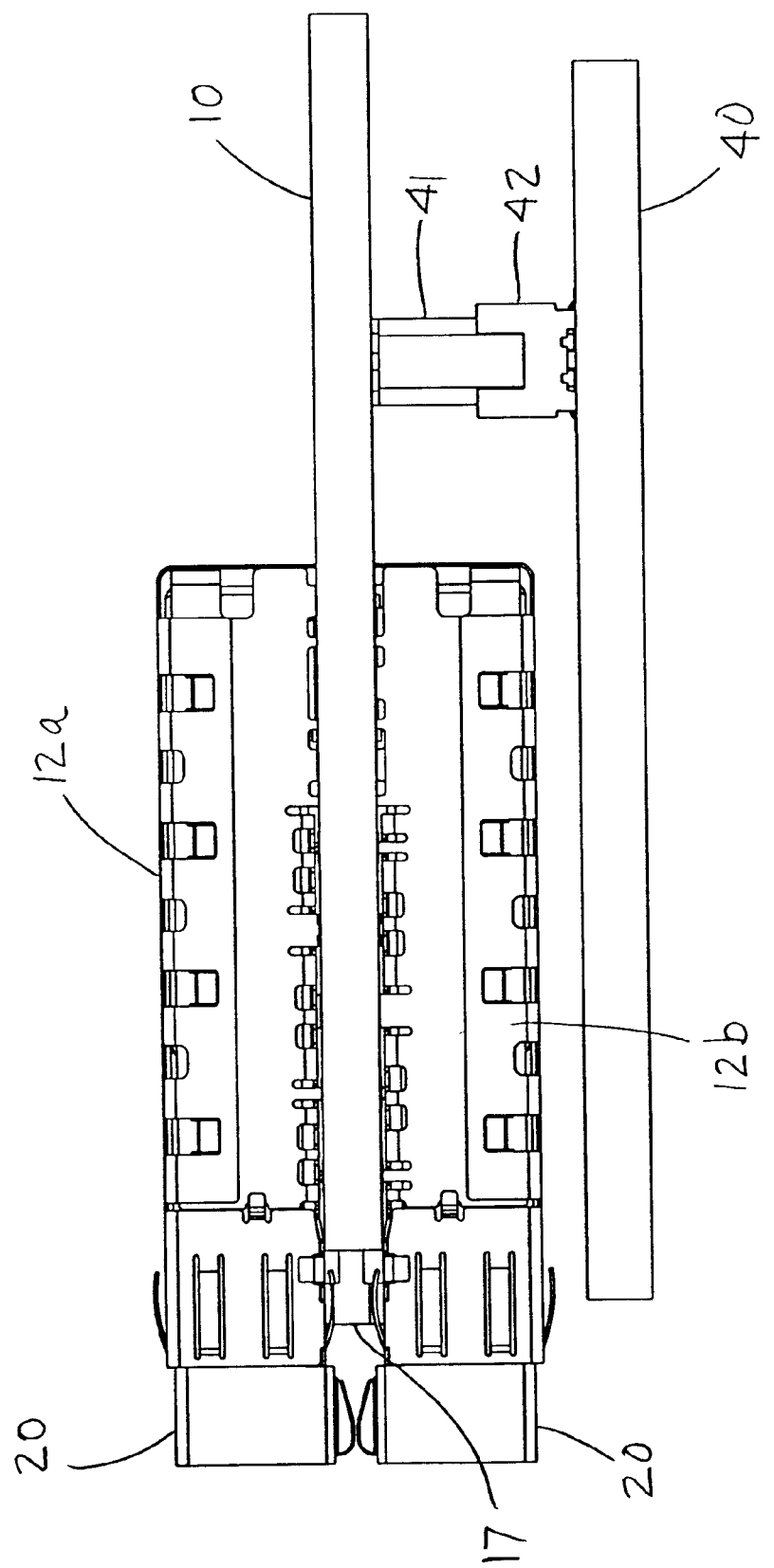
FIG. 5 is a side elevation view of the stacked transceiver receptacle assembly shown in FIG. 4.

With reference to FIGS. 3–5, a stacked transceiver module assembly is shown mounted on a main circuit board, or motherboard, 40. The intermediate circuit board 10 and the main circuit board 40 are electrically interconnected by a mating plug 41 and receptacle 42 of a board-to-board electrical connector, such as a Mictor® connector that is sold by Tyco Electronics Corporation under part number 767003-8 for the plug and 2-767004-5 for the receptacle.

Also shown is a bezel spacer 17 that is mounted in a gap between the individual transceiver receptacles 12a, 12b. The bezel spacer 17 is configured for use with a two-by-two array of receptacle connectors. A similar bezel spacer that is configured for use with a two-by-four array will be discussed more fully below.

Figure 6:
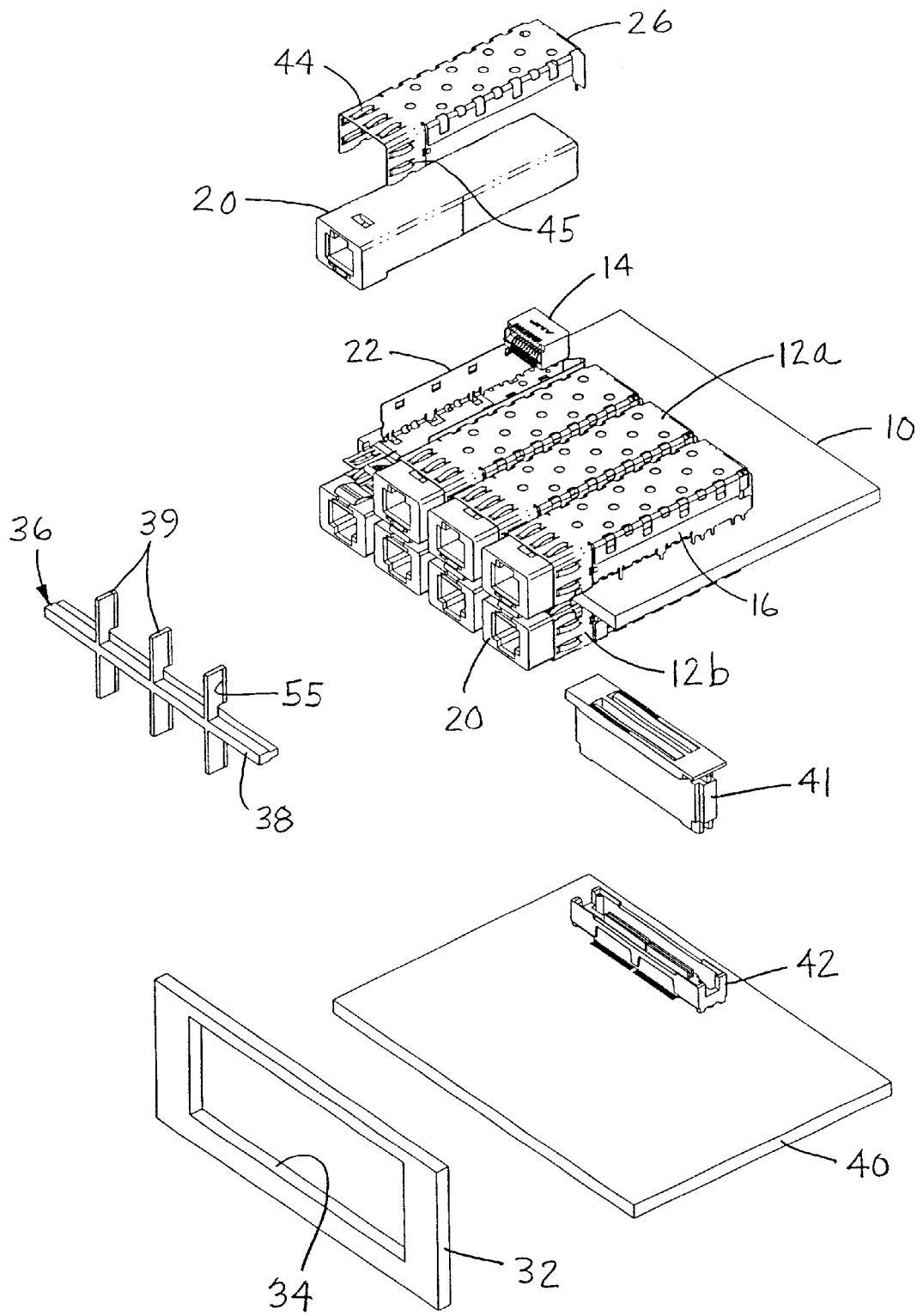
FIG. 6 is an exploded isometric view of a two-by-four stacked transceiver receptacle assembly with transceiver modules.

There is shown in FIG. 6 a two-by-four stacked transceiver assembly which uses the same transceiver receptacles 12a, 12b and transceiver modules 20 as in the previous example. The stacked transceiver assembly is mounted behind a bezel 32 in communications equipment, with forward ends of the shielding cages 16 disposed in an opening 34 in the bezel. The opening 34 has a size and a shape that is comparable to the size and shape of a bezel opening that can accommodate a two-by-four stacked modular jack of the type disclosed in U.S. Pat. No. 5,531,612.

The stacked transceiver assembly includes a bezel spacer 36 that is disposed between the forward ends of the shielding cages 16 within the opening 34. The bezel spacer 36, which is made from an electrically conductive material, has a main beam 38 that is disposed in a gap between the upper and lower rows of transceiver receptacles, and branches 39 that extend perpendicular to the main beam and that are disposed in gaps between adjacent ones of the shielding cages in each row. The bezel spacer 36 is engaged by resilient ground tabs 44 of the shielding cages 16, thereby frictionally retaining the bezel spacer between the shielding cages and providing a common ground path between all of the shielding cages. Also, the branches 39 of the bezel spacer have shoulders 55 that are gripped by free ends 45 of the ground tabs 44, thereby locking the bezel spacer in the assembly. The bezel spacer 36 could also be secured to the intermediate circuit board 10 by screw fasteners (not shown).

The bezel spacer 36 serves to seal the gaps between the shielding cages in order to reduce propagation of EMI, and the bezel spacer helps to locate the fronts of the shielding cages within the opening 34. The bezel spacer may also have tines that grip the intermediate circuit board, and these tines may be soldered to a ground plane on the intermediate circuit board.

The invention permits multiple transceiver modules to be stacked in a dense array, thereby reducing space requirements. The transceiver modules are received in transceiver receptacles that are mounted on opposite sides of an intermediate circuit board. The transceiver receptacles and the intermediate circuit board can be manufactured as a subassembly that is easily connected to a motherboard with a standard connector. Also, the intermediate circuit board can contain passive components that are designed to complement the type of transceiver module being used, thereby saving space on the motherboard.

We claim:

1. An electrical connector assembly comprising:

an intermediate circuit board;

a plurality of first transceiver receptacles mounted on one side of the intermediate circuit board, and a plurality of second transceiver receptacles mounted on an opposite side of the intermediate circuit board, each of the first and the second transceiver receptacles including a host connector disposed within a shielding cage, the host connector being electrically connected to the intermediate circuit board and being configured for electrically mating with a respective transceiver module, the shielding cage being configured to receive and guide the respective transceiver module into mating engagement with the host connector, wherein the shielding cages of the first and the second transceiver receptacles are spaced-apart from each other by gaps, and further comprising an electrically conductive bezel spacer that is disposed in the gaps, wherein the bezel spacer includes a main beam and branches extending perpendicular to the main beam.

2. The electrical connector assembly of claim 1, wherein the first and the second transceiver receptacles are identical.

3. The electrical connector assembly of claim 2, wherein the first and the second transceiver receptacles are in a mirror-image relationship with each other.

4. The electrical connector assembly of claim 1, further comprising an electrical connector mounted on the intermediate circuit board and adapted to mate with a corresponding connector mounted on a primary circuit board.

5. The electrical connector assembly of claim 1, further comprising transceiver modules disposed in the first and the second transceiver receptacles.

6. An electrical connector assembly comprising:

an intermediate circuit board;

a plurality of first host connectors mounted on one side of the intermediate circuit board, and a plurality of second host connectors mounted on an opposite side of the intermediate circuit board; and transceiver modules in mating engagement with respective ones of the first and the second host connectors, wherein each of the first and the second host connectors is disposed within a respective shielding cage, wherein the shielding cages are spaced-apart from each other, and further comprising an electrically conductive bezel spacer that is disposed between the shielding cages and electrically engaged with the shielding cages, wherein the bezel spacer includes a main beam and branches extending perpendicular to the main beam.

7. The electrical connector assembly of claim 6, and further comprising an electrical connector mounted on the intermediate circuit board and adapted to mate with a corresponding connector mounted on a primary circuit board.

8. An electrical connector assembly comprising:

an intermediate circuit board;

a plurality of first transceiver receptacles mounted on one side of the intermediate circuit board, and a plurality of second transceiver receptacles mounted on an opposite side of the intermediate circuit board, each of the first and the second transceiver receptacles including a host connector disposed within a shielding cage, the host connector being electrically connected to the intermediate circuit board and being configured for electrically mating with a respective transceiver module, the shielding cage being configured to receive and guide the respective transceiver module into mating engagement with the host connector; and transceiver modules disposed in respective ones of the first and the second transceiver receptacles, wherein the shielding cages of the first and the second transceiver receptacles are spaced-apart from each other by gaps, and further comprising an electrically conductive bezel spacer that is disposed in the gaps, wherein the bezel spacer includes a main beam and branches extending perpendicular to the main beam.

9. The electrical connector assembly of claim 8, further comprising an electrical connector mounted on the intermediate circuit board and adapted to mate with a corresponding connector mounted on a primary circuit board.

10. The electrical connector assembly of claim 8, wherein the first and the second transceiver receptacles are identical.

11. The electrical connector assembly of claim 8 wherein the first and the second transceiver receptacles are in a mirror-image relationship with each other.

* * * * *